(12) United States Patent
Mulkens et al.

(10) Patent No.: US 8,259,289 B2
(45) Date of Patent: Sep. 4, 2012

(54) LITHOGRAPHIC APPARATUS AND DEVICE MANUFACTURING METHOD

(75) Inventors: Johannes Catharinus Hubertus Mulkens, Waalre (NL); Robert-Han Munnig Schmidt, Hapert (NL)

(73) Assignee: ASML Netherlands B.V., Veldhoven (NL)

( * ) Notice: Subject to any disclaimer, the term of this patent is extended or adjusted under 35 U.S.C. 154(b) by 471 days.

(21) Appl. No.: 12/493,592

(22) Filed: Jun. 29, 2009

(65) Prior Publication Data

US 2009/0263734 A1 Oct. 22, 2009

Related U.S. Application Data

(62) Division of application No. 11/512,434, filed on Aug. 30, 2006, now Pat. No. 7,567,338.

(51) Int. Cl.
*G03B 27/42* (2006.01)
*G03B 27/52* (2006.01)

(52) U.S. Cl. ............................................ 355/53; 355/30

(58) Field of Classification Search ................... 355/30, 355/53
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,523,193 A | 6/1996 | Nelson | |
| 6,766,817 B2 | 7/2004 | da Silva | |
| 6,918,404 B2 | 7/2005 | Dias da Silva | |
| 7,066,586 B2 | 6/2006 | da Silva | |
| 7,567,338 B2 | 7/2009 | Mulkens et al. | |
| 2006/0012770 A1 | 1/2006 | Dierichs | |
| 2006/0023184 A1 | 2/2006 | Coon et al. | |
| 2006/0209286 A1* | 9/2006 | Nakano | 355/53 |
| 2007/0109513 A1 | 5/2007 | Antonius Leenders et al. | |
| 2007/0201011 A1 | 8/2007 | Kokubun et al. | |
| 2008/0073602 A1 | 3/2008 | Jacobs et al. | |
| 2008/0266533 A1* | 10/2008 | Nagasaka et al. | 355/30 |

FOREIGN PATENT DOCUMENTS

| | | |
|---|---|---|
| WO | WO 98/33096 A1 | 7/1998 |
| WO | WO 98/38597 A2 | 9/1998 |
| WO | WO 98/38597 A3 | 9/1998 |
| WO | WO 2005122221 A1 * | 12/2005 |

OTHER PUBLICATIONS

Notice of Allowance mailed May 14, 2009 for U.S. Appl. No. 11/512,434, 11 pgs.

* cited by examiner

*Primary Examiner* — Peter B Kim
(74) *Attorney, Agent, or Firm* — Sterne, Kessler, Goldstein & Fox P.L.L.C.

(57) ABSTRACT

In optical maskless lithography, scanning of a single substrate is typically much slower than in conventional lithography. Solutions are described for the adoption of immersion lithography techniques into optical maskless lithography and in particular provides one or more solutions to reduce the amount of time which the immersion liquid is in contact with any given part of the top surface of the substrate during imaging.

12 Claims, 6 Drawing Sheets

Fig. 7
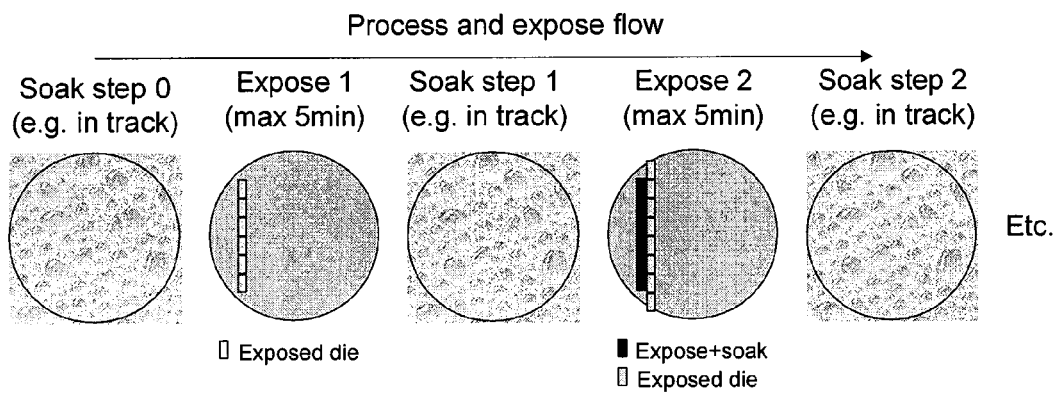
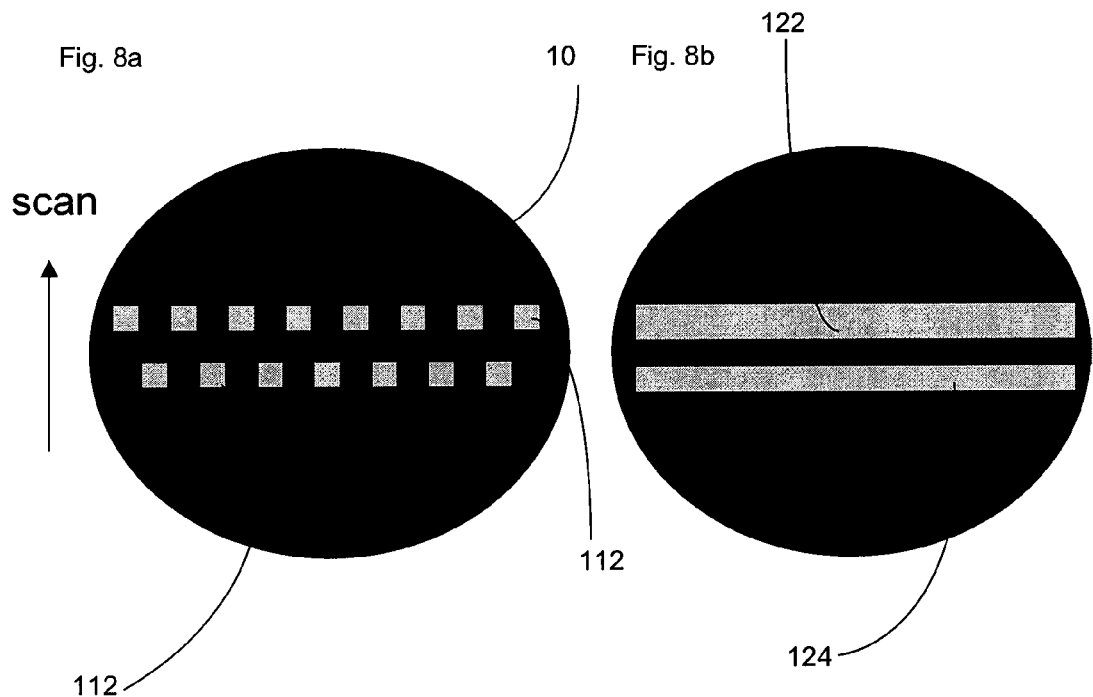

LITHOGRAPHIC APPARATUS AND DEVICE MANUFACTURING METHOD

CROSS REFERENCE TO RELATED APPLICATION

This application is a divisional application of U.S. patent application Ser. No. 11/512,434, filed Aug. 30, 2006, now U.S. Pat. No. 7,567,338, entitled "Lithographic Apparatus and Device Manufacturing Method," which is incorporated herein by reference in its entirety.

BACKGROUND

1. Field

The present invention relates to a lithographic apparatus and a method for manufacturing a device.

2. Related Art

A lithographic apparatus is a machine that applies a desired pattern onto a substrate or part of a substrate. A lithographic apparatus may be used, for example, in the manufacture of flat panel displays, integrated circuits (ICs) and other devices involving fine structures. In a conventional apparatus, a patterning device, which may be referred to as a mask or a reticle, may be used to generate a pattern corresponding to an individual layer of a flat panel display (or other device). This pattern may be transferred on (part of) the substrate (e.g. a glass plate), e.g. via imaging onto a layer of radiation-sensitive material (resist) provided on the substrate.

The patterning device may be used to generate various patterns, for example a color filter pattern, or a matrix of dots. Instead of a mask, the patterning device may comprise a patterning array that comprises an array of individually controllable elements. An advantage of such a system compared to a mask-based system is that the pattern can be changed more quickly and for less cost.

A flat panel display substrate may be rectangular in shape. Lithographic apparatus designed to expose a substrate of this type may provide an exposure region which covers a full width of the rectangular substrate, or which covers a portion of the width (for example half of the width). The substrate may be scanned underneath the exposure region, while the mask or reticle is synchronously scanned through the beam of radiation. In this way, the pattern is transferred to the substrate. If the exposure region covers the full width of the substrate then exposure may be completed with a single scan. If the exposure region covers, for example, half of the width of the substrate, then the substrate may be moved transversely after the first scan, and a further scan is typically performed to expose the remainder of the substrate.

The use of an immersion liquid between the projection system and the substrate has been suggested for use in a conventional lithography apparatus with a mask. Because the refractive index of the immersion liquid is greater than that of, for example, air, it may be possible to image smaller features on the substrate than when, for example, air is between the projection system and the substrate.

SUMMARY

A difficulty with incorporating the use of an immersion liquid in optical maskless lithography is the increased length of time it takes to scan a substrate in optical maskless lithography over that of conventional lithography in which a mask is used. The longer the time it takes, the more sensitive the immersion process becomes with regard to defects printed in the resist.

It is desirable, for example, to provide a lithographic apparatus and method to address the difficulty which arises due to the longer amount of time it takes to image a substrate using optical maskless lithography over a conventional lithography technique using a mask.

In an embodiment, there is provided a lithographic apparatus, comprising:

an illumination system configured to condition a radiation beam, the illumination system configured to illuminate a nominal field on a substrate;

an array of individually controllable elements capable of modulating at least part of a cross-section of the radiation beam;

a projection system configured to project the modulated radiation beam onto a target portion of a substrate; and a liquid supply system configured to provide a liquid to a space between the projection system and the substrate for the modulated radiation beam to pass through, the liquid supply system comprising a liquid supply limiter configured to limit an area of a top surface of the substrate to which liquid is supplied to a size smaller than the nominal field.

In an embodiment, there is provided a lithographic projection apparatus, comprising:

an array of individually controllable elements capable of modulating a cross-section of a radiation beam;

a projection system configured to project the modulated radiation beam onto a target portion of a substrate; and a liquid supply system configured to provide a liquid to a space between the projection system and the substrate, the liquid supply system comprising a lower part configured to supply liquid to and remove liquid from a top surface of the substrate, and an upper part to supply liquid to and remove liquid from the remainder of the space, wherein there is a step change in cross-sectional area, in a plane substantially perpendicular to a direction of propagation of the beam, to which liquid is supplied between the upper and lower parts.

According to an embodiment, there is provided a device manufacturing method, comprising:

(a) projecting a modulated beam of radiation, onto a substrate, through a liquid on a top surface of the substrate;

(b) moving the substrate in a first direction; and (c) continuing (a) and (b) until an edge of an area to be imaged has been imaged.

According to an embodiment, there is provided a device manufacturing method, comprising:

projecting a modulated beam of radiation, onto a substrate, through a liquid on a localized area of a top surface of the substrate; and after the projecting, covering the top surface of the substrate in liquid prior to again projecting the modulated beam of radiation, onto the substrate, through liquid on a localized area of the top surface of the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 7 depicts schematically a method according to an embodiment of the invention;

FIGS. 8*a* and 8*b* depict, in plan, designs of a liquid supply system of an embodiment of the invention.

DETAILED DESCRIPTION

Figure 1:
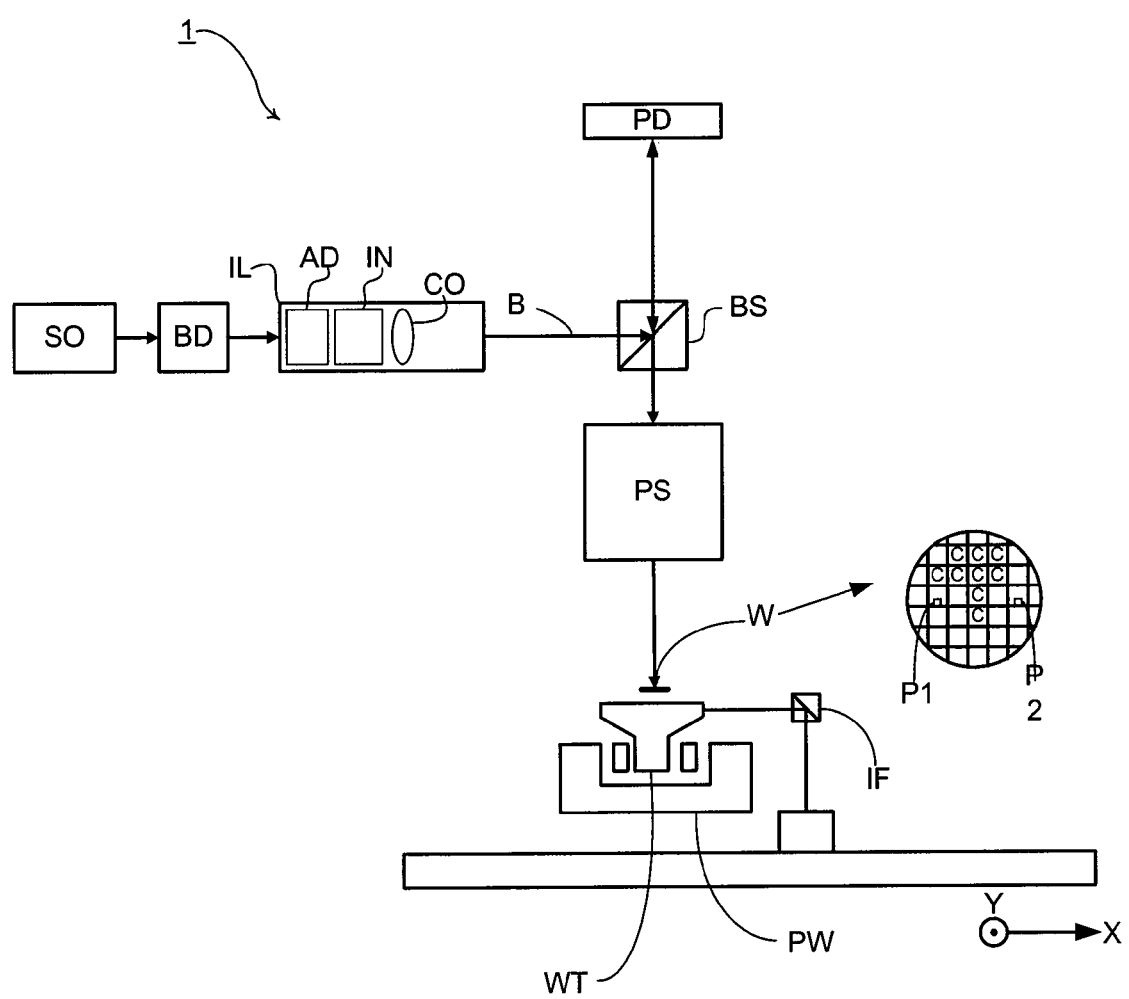
FIG. 1 depicts a lithographic apparatus according to an embodiment of the invention.

FIG. 1 schematically depicts a lithographic apparatus according to an embodiment of the invention. The apparatus comprises:

an illumination system (illuminator) IL configured to condition a radiation beam B (e.g. UV radiation);

a patterning device PD (e.g. an array of individually controllable elements) configured to modulate the radiation beam;

a substrate table WT constructed to support a substrate (e.g. a resist-coated substrate) W and connected to a positioner PW configured to accurately position the substrate in accordance with certain parameters; and a projection system (e.g. a refractive projection lens system) PS configured to project the beam of radiation modulated by the array of individually controllable elements onto a target portion C (e.g. comprising one or more dies) of the substrate W.

In general, for example, the position of the array of individually controllable elements will be fixed relative to the projection system PS. However, it may instead be connected to a positioner configured to accurately position the array of individually controllable elements in accordance with certain parameters.

The illumination system may include various types of optical components, such as refractive, reflective, magnetic, electromagnetic, electrostatic or other types of optical components, or any combination thereof, for directing, shaping, or controlling radiation.

The term "patterning device", used herein should be broadly interpreted as referring to any device that can be used to modulate the cross-section of a radiation beam such as to create a pattern in a target portion of the substrate. It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes. Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays. A patterning device whose pattern is programmable with the aid of electronic means (e.g., a computer), such as a patterning device comprising a plurality of programmable elements, that can each modulate the intensity of a portion of the radiation beam (e.g., any of the devices mentioned in the previous sentence except for the reticle), are collectively referred to herein as "contrast devices". It should be appreciated that an electronically programmable patterning device having a plurality of programmable elements that impart a pattern to the radiation beam by modulating the phase of a portion of the radiation beam relative to adjacent portions of the radiation beam may also be used. In an embodiment, the patterning device comprises at least 10 programmable elements, e.g. at least 100, at least 1000, at least 10000, at least 100000, at least 1000000, or at least 10000000 programmable elements. Embodiments of several of these devices are discussed in some more detail below:

A programmable mirror array. This may comprise a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate spatial filter, the undiffracted radiation can be filtered out of the reflected beam, leaving only the diffracted radiation to reach the substrate; in this manner, the beam becomes patterned according to the addressing pattern of the matrix-addressable surface. It will be appreciated that, as an alternative, the filter may filter out the diffracted radiation, leaving the undiffracted radiation to reach the substrate. An array of diffractive optical MEMS devices may also be used in a corresponding manner. A diffractive optical MEMS device is comprised of a plurality of reflective ribbons that may be deformed relative to one another to form a grating that reflects incident radiation as diffracted radiation. A further alternative embodiment of a programmable mirror array employs a matrix arrangement of tiny mirrors, each of which may be individually tilted about an axis by applying a suitable localized electric field, or by employing piezoelectric actuation means. Once again, the mirrors are matrix-addressable, such that addressed mirrors reflect an incoming radiation beam in a different direction to unaddressed mirrors; in this manner, the reflected beam may be patterned according to the addressing pattern of the matrix-addressable mirrors. The required matrix addressing may be performed using suitable electronic means. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference in their entirety.

A programmable LCD array. An example of such a construction is given in U.S. Pat. No. 5,229,872, which is incorporated herein by reference in its entirety.

The lithographic apparatus may comprise one or more patterning devices. For example, it may have a plurality of arrays of individually controllable elements, each controlled independently of each other. In such an arrangement, some or all of the arrays of individually controllable elements may have a common illumination system (or part of an illumination system), a common support structure for the arrays of individually controllable elements, and/or a common projection system (or part of the projection system).

In an embodiment, such as the embodiment depicted in FIG. 1, the substrate W has a substantially circular shape, optionally with a notch and/or a flattened edge along part of its perimeter. In an embodiment, the substrate has a polygonal shape, e.g. a rectangular shape. An embodiments where the substrate has a substantially circular shape includes an embodiment where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In an embodiment, the substrate has a diameter of at most 500 mm, at most 400 mm, at most 350 mm, at most 300 mm, at most 250 mm, at most 200 mm, at most 150 mm, at most 100 mm, or at most 75 mm. An embodiment where the substrate is polygonal, e.g. rectangular, includes an embodiment where at least one side, e.g., at least 2 sides or at least 3 sides, of the substrate has a length of at least 5 cm, e.g. at least 25 cm, at least 50 cm, at least 100 cm, at least 150 cm, at least 200 cm, or at least 250 cm. In an embodiment, at least one side of the substrate has a length of at most 1000 cm, e.g. at most 750 cm, at most 500 cm, at most 350 cm, at most 250 cm, at most 150 cm, or at most 75 cm. In an embodiment, the substrate is a rectangular substrate having a length of about 250-350 cm and a width of about 250-300 cm. The thickness of the substrate may vary and, to an extent, may depend, e.g., on the substrate material and/or the substrate dimensions. In an embodiment, the thickness is at least 50 µm, for instance at least 100 µm, at least 200 µm, at least 300 µm, at least 400 µm, at least 500 µm, or at least 600 µm. In one embodiment, the thickness of the substrate is at most 5000 µm, for instance at most 3500 µm, at most 2500 µm, at most 1750 µm, at most 1250 µm, at most 1000 µm, at most 800 µm, at most 600 µm, at most 500 µm, at most 400 µm, or at most 300 µm. The substrate referred to herein may be processed, before or after exposure, in for example a track (a tool that typically applies a layer of resist to a substrate and develops the exposed resist), a metrology tool and/or an inspection tool.

In an embodiment, a resist layer is provided on the substrate. In an embodiment, the substrate W is a wafer, for instance a semiconductor wafer. In an embodiment, the wafer material is selected from the group consisting of Si, SiGe, SiGeC, SiC, Ge, GaAs, InP, and InAs. In an embodiment, the wafer is a III/V compound semiconductor wafer. In an embodiment, the wafer is a silicon wafer. In an embodiment, the substrate is a ceramic substrate. In an embodiment, the substrate is a glass substrate. A glass substrate may be useful, e.g., in the manufacture of flat panel displays and liquid crystal display panels. In an embodiment, the substrate is a plastic substrate. In an embodiment, the substrate is transparent (to the naked human eye). In an embodiment, the substrate is colored. In an embodiment, the substrate is absent a color.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The projection system may image the pattern on the array of individually controllable elements such that the pattern is coherently formed on the substrate; alternatively, the projection system may image secondary sources for which the elements of the array of individually controllable elements act as shutters. In this respect, the projection system may comprise an array of focusing elements such as a micro lens array (known as an MLA) or a Fresnel lens array, e.g. to form the secondary sources and to image spots onto the substrate. In an embodiment, the array of focusing elements (e.g., MLA) comprises at least 10 focus elements, e.g., at least 100 focus elements, at least 1000 focus elements, at least 10000 focus elements, at least 100000 focus elements, or at least 1000000 focus elements. In an embodiment, the number of individually controllable elements in the patterning device is equal to or greater than the number of focusing elements in the array of focusing elements. In an embodiment, the array of focusing elements comprises a focusing element that is optically associated with one or more of the individually controllable elements in the array of individually controllable elements, e.g. with 2 or more of the individually controllable elements in the array of individually controllable elements, such as 3 or more, 5 or more, 10 or more, 20 or more, 25 or more, 35 or more, or 50 or more. In an embodiment, the array of focusing elements comprises more than one focusing element (e.g. more than 1000, the majority, or about all) that is optically associated with one or more of the individually controllable elements in the array of individually controllable elements. In an embodiment, the MLA is movable (e.g. with the use of an actuator) at least in the direction to and away from the substrate, e.g. with the use of the actuator. Being able to move the MLA to and away from the substrate allows, e.g., for focus adjustment without having to move the substrate.

As here depicted, the apparatus is of a reflective type (e.g. employing a reflective array of individually controllable elements). Alternatively, the apparatus may be of a transmissive type (e.g. employing a transmissive array of individually controllable elements).

The lithographic apparatus may be of a type having two (dual stage) or more substrate tables. In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by an immersion liquid having a relatively high refractive index, e.g. water, so as to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. In an embodiment, the radiation source provides radiation having a wavelength of at least 5 nm, e.g. at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In an embodiment, the radiation provided by radiation source SO has a wavelength of at most 450 nm, e.g. at most 425 nm, at most 375 nm, at most 360 nm, at most 325 nm, at most 275 nm, at most 250 nm, at most 225 nm, at most 200 nm, or at most 175 nm. In an embodiment, the radiation has a wavelength including 436 nm, 405 nm, 365 nm, 355 nm, 248 nm, 193 nm, 157 nm, and/or 126 nm. In an embodiment, the radiation includes a wavelength of around 365 nm or around 355 nm. In an embodiment, the radiation includes a broad band of wavelengths, for example encompassing 365, 405 and 436 nm. A 355 nm laser source could be used. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system. If the patterning device is a radiation source itself, e.g. a laser diode array or a light emitting diode array, the apparatus may be designed without an illumination system or at least a simplified illumination system (e.g., the need for radiation source SO may be obviated).

The illuminator IL, may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam to have a desired uniformity and intensity distribution in its cross-section. The illuminator IL, or an additional component associated with it, may also be arranged to divide the radiation beam into a plurality of sub-beams that may, for example, each be associated with one or a plurality of the individually controllable elements of the array of individually controllable elements. A two-dimensional diffraction grating may, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been modulated by the patterning device PD, the radiation beam B passes through the projection system PS, which focuses the beam onto a target portion C of the substrate W. With the aid of the positioner PW and position sensor IF (e.g. an interferometric device, linear encoder or capacitive sensor), the substrate table WT can be moved accurately, e.g. so as to position different target portions C in the path of the radiation beam B. Where used, the positioning means for the array of individually controllable elements can be used to correct accurately the position of the patterning device PD with respect to the path of the beam B, e.g. during a scan. In an embodiment, movement of the substrate table WT is realized with the aid of a long-stroke module (coarse positioning) and a short-stroke module (fine positioning), which are not explicitly depicted in FIG. 1. In an embodiment, the apparatus is absent at least a short stroke module for moving substrate table WT. A similar system may also be used to position the array of individually controllable elements. It will be appreciated that the beam B may alternatively/additionally be moveable while the object table and/or the array of individually controllable elements may have a fixed position to provide the required relative movement. Such an arrangement may assist in limiting the size of the apparatus. As a further alternative, which may e.g. be applicable in the manufacture of flat panel displays, the position of the substrate table WT and the projection system PS may be fixed and the substrate W may be arranged to be moved relative to the substrate table WT. For example, the substrate table WT may be provided with a system for scanning the substrate W across it at a substantially constant velocity.

As shown in FIG. 1, the beam of radiation B may be directed to the patterning device PD by means of a beam splitter BS configured such that the radiation is initially reflected by the beam splitter and directed to the patterning device PD. It should be realized that the beam of radiation B may also be directed at the patterning device without the use of a beam splitter. In an embodiment, the beam of radiation is directed at the patterning device at an angle between 0° and 90°, e.g. between 5° and 85°, between 15° and 75°, between 25° and 65°, or between 35° and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements may be used to direct the beam of radiation B to the patterning device PD and subsequently to the projection system PS. In particular, an arrangement such as is shown in FIG. 1 may not be required if a transmissive patterning device is used.

The depicted apparatus can be used in one or more of four modes:

1. In step mode, the array of individually controllable elements and the substrate are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e. a single dynamic exposure). The velocity and direction of the substrate relative to the array of individually controllable elements may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. In continuous scan mode, essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements may be used.

Combinations and/or variations on the above described modes of use or entirely different modes of use may also be employed.

In lithography, a pattern is typically exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern may be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, for example, the radiation dose at an edge of a pattern feature does not abruptly change from a given dose exceeding the threshold to a given dose below the threshold (e.g. zero) dose even if the individually controllable elements are set to provide the radiation intensity exceeding the threshold on one side of the feature boundary and the radiation intensity below the threshold on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary not only to intensity levels above or below the threshold but also to intensity levels between those intensity levels. This is commonly referred to as "grayscaling".

Grayscaling provides greater control of the position of the pattern feature boundaries than is possible in a lithography system in which the radiation intensity provided to the substrate by a given individually controllable element can only be set to two values (e.g., just a maximum value and a minimum value). In an embodiment, at least three different radiation intensity values can be projected onto the substrate, e.g. at least 4 radiation intensity values, at least 8 radiation intensity values, at least 16 radiation intensity values, at least 32 radiation intensity values, at least 64 radiation intensity values, at least 128 radiation intensity values or at least 256 radiation intensity values.

It should be appreciated that grayscaling may be used for additional or alternative purposes to that described above. For example, the processing of the substrate after the exposure may be tuned such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling may be used to provide a radiation dose profile across the substrate having more than two desired dose levels. In an embodiment, the radiation dose profile has at least 2 desired dose levels, e.g. at least 3 desired radiation dose levels, at least 4 desired radiation dose levels, at least 6 desired radiation dose levels or at least 8 desired radiation dose levels.

It should further be appreciated that the radiation dose profile may be controlled by a method other than by merely controlling the intensity of the radiation received at each point on the substrate, as described above. For example, the radiation dose received by each point on the substrate may alternatively or additionally be controlled by controlling the duration of the exposure of the point. As a further example, each point on the substrate may potentially receive radiation in a plurality of successive exposures. The radiation dose received by each point may, therefore, be alternatively or additionally controlled by exposing the point using a selected subset of the plurality of successive exposures.

In order to form the desired pattern on the substrate, each of the individually controllable elements in the patterning device is set to the requisite state at each stage during the exposure process. Therefore control signals, representing the requisite states, are transmitted to each of the individually controllable elements. In an embodiment, the lithographic apparatus includes a controller that generates the control signals. The pattern to be formed on the substrate may be provided to the lithographic apparatus in a vector-defined format such as GDSII. In order to convert the design information into the control signals for each individually controllable element, the controller includes one or more data manipulation devices, each configured to perform a processing step on a data stream that represents the pattern. The data manipulation devices may collectively be referred to as the "datapath".

The data manipulation devices of the datapath may be configured to perform one or more of the following functions: converting vector-based design information into bitmap pattern data; converting bitmap pattern data into a radiation dose map (namely a radiation dose profile across the substrate); converting a radiation dose map into radiation intensity values for each individually controllable element; and converting the radiation intensity values for each individually controllable element into corresponding control signals.

Figure 2:
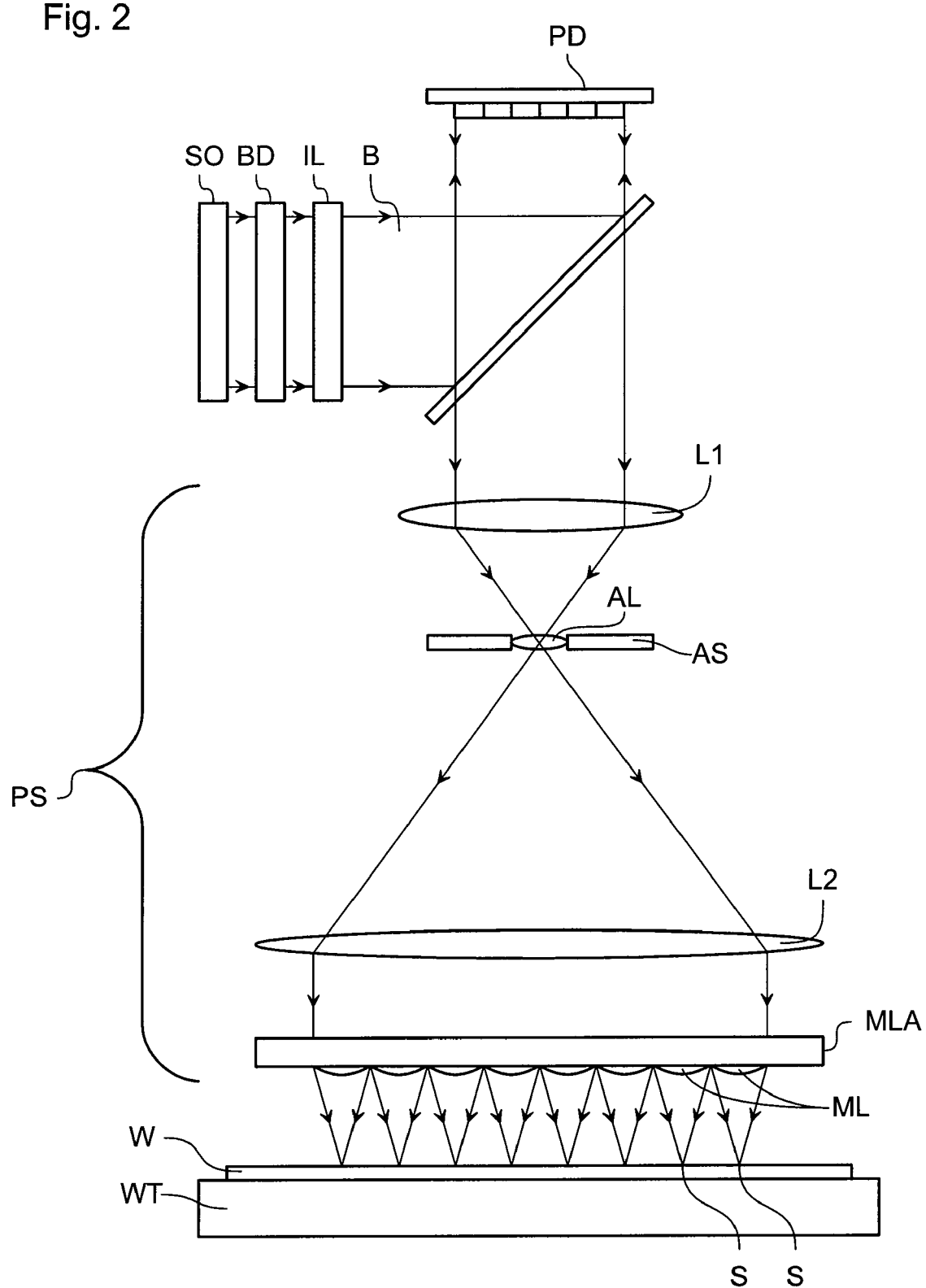
FIG. 2 depicts a lithographic apparatus according to another embodiment of the invention.

FIG. 2 depicts an arrangement of the apparatus according to an embodiment of the present invention that may be used, e.g., in the manufacture of flat panel displays. Components corresponding to those shown in FIG. 1 are depicted with the same reference numerals. Also, the above descriptions of the various embodiments, e.g. the various configurations of the substrate, the contrast device, the MLA, the beam of radiation, etc., remain applicable.

As shown in FIG. 2 the projection system PS includes a beam expander, which comprises two lenses L1, L2. The first lens L1 is arranged to receive the modulated radiation beam B and focus it through an aperture in an aperture stop AS. A further lens AL may be located in the aperture. The radiation beam B then diverges and is focused by the second lens L2 (e.g., a field lens).

The projection system PS further comprises an array of lenses MLA arranged to receive the expanded modulated radiation beam B. Different portions of the modulated radiation beam B, corresponding to one or more of the individually controllable elements in the patterning device PD, pass through respective different lenses in the array of lenses MLA. Each lens ML focuses the respective portion of the modulated radiation beam B to a point that lies on the substrate W. In this way an array of radiation spots S is exposed onto the substrate W. It will be appreciated that, although only eight lenses ML of the illustrated array of lenses MLA are shown, the array of lenses may comprise many thousands of lenses (the same is true of the array of individually controllable elements used as the patterning device PD).

Figure 3:
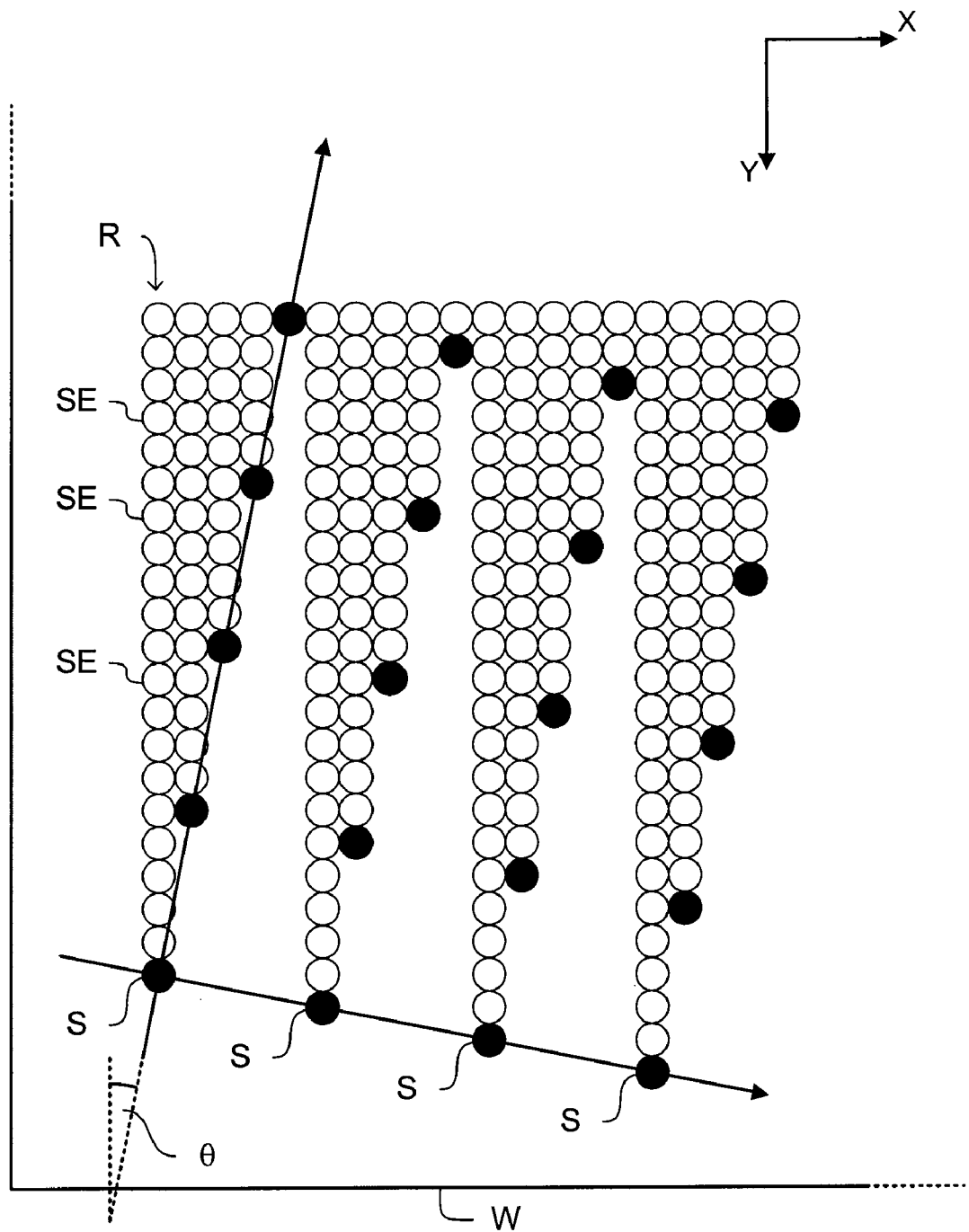
FIG. 3 depicts a mode of transferring a pattern to a substrate using an embodiment of the invention as shown in FIG. 2.

FIG. 3 illustrates schematically how the pattern on the substrate W may be generated. The filled in circles represent the array of spots S projected onto the substrate by the array of lenses MLA in the projection system PS. The substrate is moved relative to the projection system in the Y direction as a series of exposures are exposed on the substrate. The open circles represent spot exposures SE that have previously been exposed on the substrate. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging."

It can be seen that the array of radiation spots S is arranged at an angle $\theta$ relative to the substrate W (the edges of the substrate lie substantially parallel to the X and Y directions). This is done so that when the substrate is moved in the scanning direction (the Y-direction), each radiation spot will pass over a different area of the substrate, thereby allowing the entire substrate to be covered by the array of radiation spots S. In an embodiment, the angle $\theta$ is at most 20°, at most 10°, at most 5°, at most 3°, at most 1°, at most 0.5°, at most 0.25°, at most 0.10°, at most 0.05°, or at most 0.01°. In an embodiment, the angle $\theta$ is at least 0.0001°.

Figure 4:
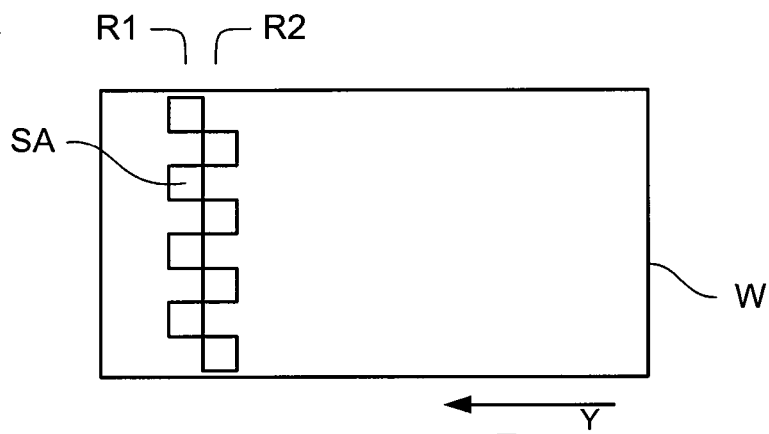
FIG. 4 depicts an arrangement of optical engines.

FIG. 4 shows schematically how the entire flat panel display substrate W may be exposed in a single scan, by using a plurality of optical engines. Eight arrays SA of radiation spots S are produced by eight optical engines (not shown), arranged in two rows R1,R2 in a 'chess board' configuration such that the edge of one array of radiation spots S slightly overlaps (in the scanning direction Y) with the edge of the adjacent array of radiation spots S. In an embodiment, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines may be used. In an embodiment, the number of optical engines is at least 1, at least 2, at least 4, at least 8, at least 10, at least 12, at least 14, or at least 17. In an embodiment, the number of optical engines is less than 40, e.g. less than 30 or less than 20.

Each optical engine may comprise a separate illumination system IL, patterning device PD and projection system PS as described above. It is to be appreciated, however, that two or more optical engines may share at least a part of one or more of the illumination system, patterning device and projection system.

Figure 5:
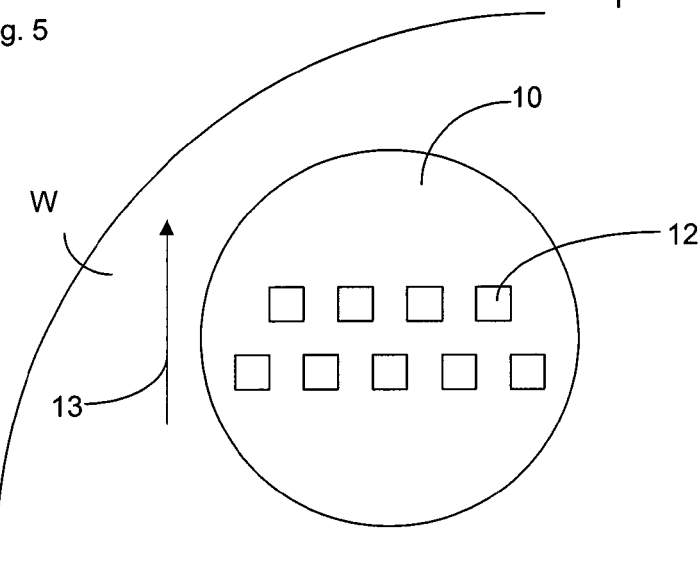
FIG. 5 depicts, in plan, the principle of optical maskless lithography.

In optical maskless lithography the patterning device PD is made up of at least one array of individually controllable elements which are capable of modulating the cross-section of the radiation beam PB. The size of each array is often of the order of 1,000 by 1,000 pixels. However, it is not possible to closely pack these arrays (i.e. position them exactly next to each other) because of the need for electrical connections, cooling, etc. which take up space around the edge of each array. Thus, the patterning device PD comprises arrays which are spaced apart from each other which results in only small areas of the substrate being imaged at any one time. FIG. 5 illustrates a field area 10 which can be regarded as a "nominal field" and is the area which the radiation beam would cover if the arrays of individually controllable elements could modulate the entire cross-section of the beam (which is comparable to the field of a conventional mask though much smaller) in which several sub fields 12 have been highlighted. Each of these sub fields 12 is the area of the substrate W which is imaged by the beam B which has been modulated by one of the arrays of individually controllable elements. Thus, in the example there are nine arrays, but there can be any number.

The field 10 in optical maskless lithography is of the order of 120 µm in diameter. This compares with a field of about 26 mm diameter for conventional lithography. As the substrate W is scanned in direction 13 the beam B is pulsed at approximately 4 kHz (for example) and the speed of the scan is adjusted such that by exposing each sub field 12 on every cycle of the laser the top surface of the substrate to be imaged can be imaged either by tessellating the sub fields 12 or by so called poling in which the sub fields which are imaged overlap. Although it is possible for the laser to be pulsed faster (or slower), the maximum speed is usually determined by the ability of the data processors to control each array of individually controllable elements (and/or to cool those individually controlled elements).

Thus, it can be seen that in optical maskless lithography each substrate W typically takes far longer to process than using conventional lithography. Whereas the throughput of a conventional lithography machine is of the order of 100 substrates per hour, optical maskless lithography may only process a few substrates per hour.

This difference in processing speed can result in difficulty when trying to provide an immersion liquid between the projection system PS (e.g., the final element of the projection system PS) and the substrate W in order to improve the resolution of imaged features. This is because the length of time that the immersion liquid is on the top surface of the substrate W is increased if the same systems as used in optical maskless lithography are used. Defects introduced in immersion lithography typically increase with the length of time that the immersion liquid stays on the top surface of the substrate. Thus, the longer the immersion liquid stays on the substrate, the greater the chance of droplets of immersion liquid, for example, drying on the substrate and leaving behind marks.

Figure 6:
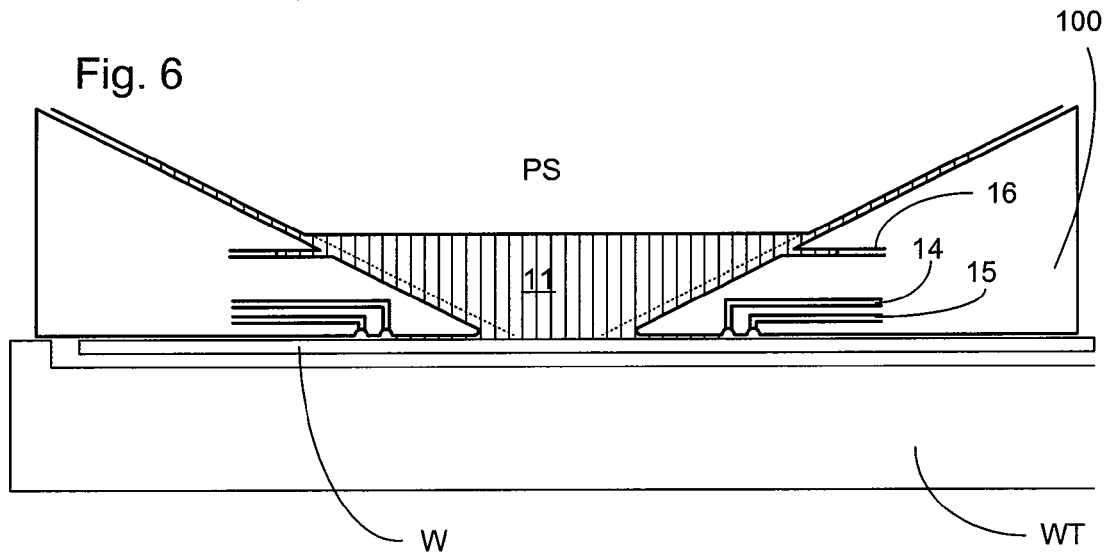
FIG. 6 depicts, in cross-section, a liquid supply system used in conventional lithography with a mask.

FIG. 6 illustrates, in cross-section, a liquid supply system which can be used in order to fill a space between the projection system PS and the substrate W with liquid 11. This liquid supply system is an example only and many other types of liquid supply system can be used instead, particularly those without a gas knife and which rely on meniscus pinning features to contain the liquid.

In the example of FIG. 6, a barrier member 100 surrounds the bottom edge of the projection system PS and forms a (contactless) seal between its bottom surface which faces the top surface of the substrate W and the substrate W. In an embodiment, the seal is formed by a flow of gas from an inlet 15 to an outlet 14. Liquid 11 is provided to the space between the projection system PS and the substrate W via liquid inlet 16. Many types of liquid supply systems have been developed for conventional lithography and many, if not all, of those can be used and/or adapted in an embodiment of the present invention. For example, U.S. patent application Ser. Nos. 11/472,566, filed Jun. 22, 2006 and 11/404,091, filed Apr. 14, 2006, both applications incorporated herein in their entirety by reference, describe different types of liquid supply system and also refer to other patents and patent applications describing other liquid supply systems. Any of these liquid supply systems can be used in an embodiment of the present invention.

FIG. 7 shows schematically an embodiment of the present invention which may be used by itself or in conjunction with any of the other embodiments of the present invention.

There are two features of the method. A first feature is the inclusion of soak steps (in which the top surface of the substrate is covered in liquid typically for between 15 and 90 seconds but could be longer or between 5 and 200 seconds) which can take place either in the lithographic apparatus or in the processing track and which take place at intervals during the processing of the substrate.

The other feature is that the substrate is scanned substantially in one direction under the projection system PS as opposed to the more usual "meandering" of the substrate which takes place beneath the projection system PS. Meandering involves the movement of the substrate in many different directions under the projection system PS and this is usually regarded as more efficient for imaging all areas of the substrate. However, for immersion optical maskless lithography it may be better to scan the substrate W mainly in only one direction (e.g. in columns) and to avoid changes in direction during one scanning run. This is because any particles or debris on the substrate W are moved out of the way in front of the liquid supply system as the substrate W is scanned.

In the process of FIG. 7 it is convenient to soak the substrate after each scan run in a single direction (which will be termed a column but it could be seen as a row). Thus, as can be seen in FIG. 7, at soak step 0, the substrate is first soaked (and then optionally dried, for example by spin drying) before the first column is imaged through liquid by scanning the substrate W under the projection system PS in one direction (which should take less than 5 minutes) at expose 1. In an embodiment, the scan is the length from one edge of the surface of the substrate W to be scanned to the other edge. The substrate is then soaked again either in the lithographic apparatus itself or in the processing track at soak step 1. During the soak time it is possible for a second substrate to be imaged (for example in a dual stage lithographic apparatus) so that throughput is not unduly affected. After the soak step 1, the substrate may optionally be dried before the second column next to the first column (or elsewhere) is imaged through liquid at expose 2. This process is repeated (e.g., soak step 2, expose 3, etc.) until all of the substrate which is to be imaged has been imaged. In an embodiment, the substrate is soaked at least every 600 seconds, at least every 400 seconds, at least every 300 seconds, at least every 200 seconds or at least every 100 seconds. The columns are illustrated as occurring from one edge of the area to be imaged to the opposite edge of the area to be imaged though of course the columns are not necessary as long as that.

Because the exposure cycle in optical maskless lithography is quite long compared to a conventional machine, a dimension of the substrate and the substrate table might differ during the imaging process, thus possibly leading to overlay errors. This dimensional change might be caused by, for example, a temperature change resulting from evaporation of immersion liquid or other sources. In order to account for such a possible size change, it is possible to perform a re-measuring step in which the top surface of the substrate is measured after the soak and drying steps prior to the further exposure of the substrate. Indeed, this idea could be used in normal optical maskless lithography where no immersion liquid is used. In this case it would not be necessary to expose the substrate in columns and a meandering path could be used, if desired. However, the same principles would apply in that only part of the top surface of the substrate would be imaged before the substrate is taken out from under the projection system and re-measured. During that re-measuring time, as in an embodiment of the present invention, another substrate could be imaged under the projection system.

FIGS. 8a and 8b depict, in plan, two designs of liquid supply system according to a further embodiment of the present invention. These designs may be used in combination with the first embodiment or in combination with a different production method.

In the liquid supply system of the second embodiment, a measure is taken to minimize or reduce the area of the top surface of the substrate on which immersion liquid is provided. This helps with the aim of minimizing or reducing the time with which the resist on the top surface of the substrate W is in contact with immersion liquid. In an embodiment, liquid is configured to be limited to an area on a top surface of the substrate less than a nominal field of the modulated beam. In an embodiment, the area may also be larger than the cross-sectional area of the modulated beam.

The dark area illustrates the field 10 which is equivalent to the field 10 of FIG. 5. The field can alternatively be seen as the aperture in the liquid supply system of FIG. 6 through which the beam B passes.

The aperture actually does not need to be completely filled with immersion liquid because the modulated beam B only impinges on sub fields 12 as illustrated in FIG. 4. Thus, the liquid supply system of FIGS. 8a and 8b comprises a liquid supply limiter which, in the case of FIG. 8a, has a plurality of apertures 112 through which the sub fields 12 can be imaged. Thus, the liquid supply limiter limits the area to which liquid is supplied to substantially only those areas 112 which correspond to the sub fields of each array of individually controllable elements.

In the embodiment of FIG. 8b, two slits 122, 124 are provided instead of the individual apertures of the embodiment of FIG. 8a. The sub fields 12 of FIG. 5 are in two lines and the slits are aligned with those sub fields. This arrangement, while not minimizing the area to which immersion liquid is applied as much as the embodiment of FIG. 8a, still reduces the area to which liquid is supplied over a conventional liquid supply system configured to cover an area corresponding to the complete field 10. However, the embodiment of FIG. 8b is likely easier to manufacture. Clearly other geometries are possible with the liquid supply limiter providing liquid on several areas each for one or more sub fields 12.

The liquid supply limiter could be engineered to seal the liquid to only the desired areas by use of, for example, meniscus pinning features such as those described above in relation to FIG. 6.

Figure 9:
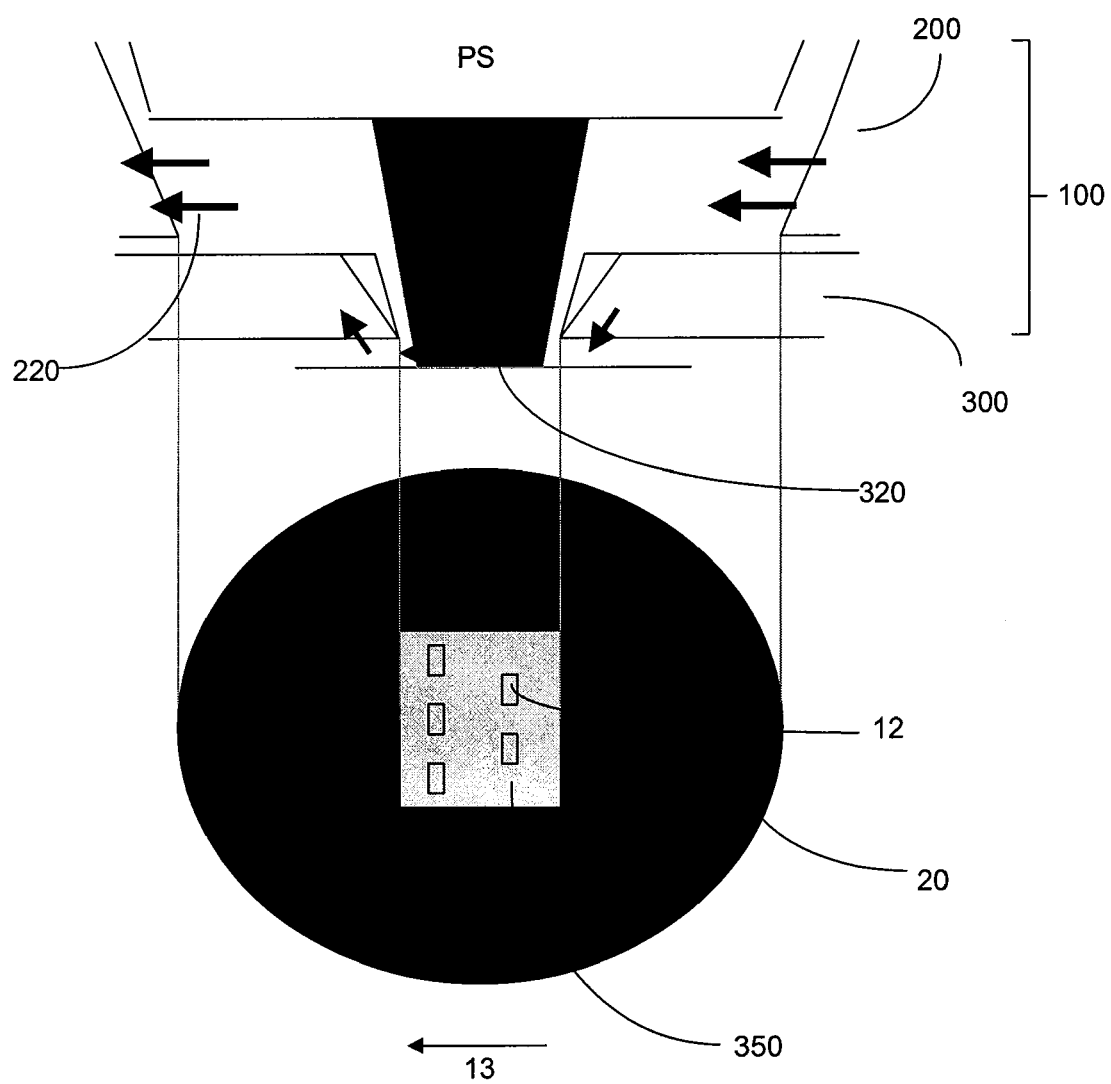
FIG. 9 illustrates schematically a liquid supply system of another embodiment.

FIG. 9 shows a further embodiment of the present invention which can be used in conjunction with one or more embodiments herein or with a different production method. In this embodiment the liquid supply system comprises two parts. There is an upper part 200 which surrounds the bottom edge of the projection system PS in the same way as the liquid supply system of FIG. 6. However, there is a further lower part 300 which only supplies liquid to a small area 350 of the field 20. This can be seen as a liquid supply limiter. The area 350 to which liquid is supplied on the surface of the substrate is illustrated in the bottom part of FIG. 9 and can be seen to enclose an area where the sub fields 12 are present.

It is advantageous to make the liquid supply system of two parts (though of course they may be permanently joined together) because the whole of the bottom surface of the projection system PS must be covered in liquid and in order to reduce the area to which immersion liquid is supplied on the substrate. For this reason the two parts are used and the liquid flow of each part is illustrated in FIG. 9 by arrows 220 and 320. The lower supply can be provided by a liquid supply system similar to that of FIG. 6. Like the embodiment described above, this arrangement reduces the area to which liquid is supplied and thereby the time of the top coat of the substrate W is contacted by liquid. In this way the upper part 200 is configured to supply liquid to a cross-sectional area in a direction perpendicular to the direction of propagation of the beam PB which is much greater than the equivalent cross-sectional area to which the lower part 300 is configured to supply liquid. There is a step change in the areas from the upper part 200 to the lower part 300.

As can be seen, in an embodiment, the lower part 300 directs the liquid with a component downwards towards the substrate W, whereas the upper part 200 simply provides a flow of liquid from one side to the other without introducing liquid with a substantial upward or downward component.

In an embodiment, the fluid supply flow 320 matches the speed of the substrate during scan 13 (in the case illustrated in FIG. 9 the substrate is being scanned from the right to the left hand side). In that case it may not be necessary to pump the liquid because the movement of the substrate W itself can be used to transport liquid from one side of the lower part 300 to the other side. If the extraction on the left hand side of the lower part 300 is matched to the supply flow, single phase extraction can be used. The separate supply flow of the upper part 200 is not so critical because the liquid from that part does not interact with the top surface of the substrate or substrate table. Another option is to provide a flow of liquid perpendicular to the scanning direction.

Although specific reference may be made in this text to the use of lithographic apparatus in the manufacture of a specific device (e.g. an integrated circuit or a flat panel display), it should be understood that the lithographic apparatus described herein may have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), etc. Also, for instance in a flat panel display, the present apparatus may be used to assist in the creation of a variety of layers, e.g. a thin film transistor layer and/or a color filter layer.

While specific embodiments of the invention have been described above, it will be appreciated that the invention may be practiced otherwise than as described. For example, where applicable, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the invention may be applied to any immersion lithography apparatus, in particular, but not exclusively, those types mentioned above. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

Having described specific embodiments of the present invention, it will be understood that many modifications thereof will readily appear or may be suggested to those skilled in the art, and it is intended therefore that this invention is limited only by the spirit and scope of the following claims.

What is claimed is:

1. A lithographic projection apparatus, comprising:
    an array of individually controllable elements configured to modulate a cross-section of a radiation beam;
    a projection system configured to project the modulated radiation beam onto a target portion of a substrate; and
    a liquid supply system configured to provide a liquid to a space between the projection system and the substrate, the liquid supply system comprising:
        a lower part configured to supply liquid to and remove liquid from a top surface of the substrate, the entire lower part having a first cross-sectional area, and
        an upper part having a second cross sectional area and configured to supply liquid to and remove liquid from the second cross-sectional area comprising the remainder of the space in a plane substantially perpendicular to a direction of propagation of the beam, to which liquid is supplied between the upper and lower parts, the second cross-sectional area being greater than the first cross-sectional area.

2. The apparatus of claim 1, further comprising a controller configured to control a supply of liquid from the lower part to be substantially at such a rate that, in use, scanning movement of the substrate is effective to transport the liquid to an outlet without the need for a pump or low pressure source.

3. The apparatus of claim 1, wherein the upper part is configured to provide liquid to the space in a direction substantially perpendicular to the direction of propagation.

4. The apparatus of claim 1, wherein the lower part is configured to provide liquid in a direction with a component towards the substrate.

5. The apparatus of claim 1, wherein there is a step change from the second cross-sectional area to the first cross-sectional area.

6. A liquid supply system, comprising:
    a lower part configured to supply liquid to and remove liquid from a top surface of a substrate, the entire lower part having a first cross-sectional area, and
    an upper part having a second cross-sectional area and configured to supply liquid to and remove liquid from the second cross-sectional area comprising a remainder of a space between a projection system and the substrate, to which liquid is supplied between the upper and lower parts, the second cross-sectional area being greater than the first cross-sectional area.

7. The liquid supply system of claim 6, wherein the liquid is supplied in a plane substantially perpendicular to a direction of propagation of a radiation beam projected from the projection system.

8. The liquid supply system of claim 7, wherein the upper part is configured to provide liquid to the space in a direction substantially perpendicular to the direction of propagation.

9. The liquid supply system of claim 7, wherein a cross-section of the radiation beam is modulated by an array of individually controllable elements.

10. The liquid supply system of claim 6, further comprising a controller configured to control a supply of liquid from the lower part to be substantially at such a rate that, in use, scanning movement of the substrate is effective to transport the liquid to an outlet without the need for a pump or low pressure source.

11. The liquid supply system of claim 6, wherein the lower part is configured to provide liquid in a direction with a component towards the substrate.

12. The liquid supply system of claim 6, wherein there is a step change from the second cross-sectional area to the first cross-sectional area.

* * * * *